(12) United States Patent
Yazaki

(10) Patent No.: US 10,791,659 B2
(45) Date of Patent: Sep. 29, 2020

(54) ELECTRONIC MODULE

(71) Applicant: Murata Manufacturing Co., Ltd., Nagaokakyo-shi, Kyoto-fu (JP)

(72) Inventor: Hirokazu Yazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/443,932

(22) Filed: Jun. 18, 2019

(65) Prior Publication Data

US 2019/0307028 A1   Oct. 3, 2019

Related U.S. Application Data

(63) Continuation of application No. PCT/JP2018/029759, filed on Aug. 8, 2018.

(30) Foreign Application Priority Data

Sep. 5, 2017   (JP) .................................. 2017-170712

(51) Int. Cl.
*H01Q 1/24* (2006.01)
*H05K 9/00* (2006.01)
*H05K 1/02* (2006.01)
*H05K 1/18* (2006.01)
*H01Q 23/00* (2006.01)
*H05K 1/11* (2006.01)

(52) U.S. Cl.
CPC ............ *H05K 9/0024* (2013.01); *H01Q 1/24* (2013.01); *H01Q 23/00* (2013.01); *H05K 1/0216* (2013.01); *H05K 1/181* (2013.01); *H05K 9/00* (2013.01); *H05K 9/0088* (2013.01); *H05K 1/115* (2013.01); *H05K 2201/083* (2013.01); *H05K 2201/10015* (2013.01); *H05K 2201/10098* (2013.01); *H05K 2201/10371* (2013.01)

(58) Field of Classification Search
CPC ............ H01Q 1/24; H01Q 23/00; H05K 9/00; H05K 1/02; H05K 1/18
USPC ........................................................ 343/841
See application file for complete search history.

(56) References Cited

U.S. PATENT DOCUMENTS

2010/0103058 A1 * 4/2010 Kato ................ G06K 19/07786
343/702

FOREIGN PATENT DOCUMENTS

| JP | 2005-051576 A | 2/2005 |
| JP | 2007-142960 A | 6/2007 |
| JP | 2007-295558 A | 11/2007 |
| JP | 2012-239205 A | 12/2012 |

OTHER PUBLICATIONS

Official Communication issued in International Patent Application No. PCT/JP2018/029759, dated Nov. 6, 2018.

* cited by examiner

*Primary Examiner* — Andrea Lindgren Baltzell
(74) *Attorney, Agent, or Firm* — Keating & Bennett, LLP

(57) ABSTRACT

An electronic module includes a substrate, electronic components mounted on the substrate, a magnetic body provided on the substrate so as to cover the electronic components, and a metal shield provided on the magnetic body. An electronic circuit is defined using the electronic components. The electronic circuit includes a signal circuit. The metal shield includes ground connection portions connected to a ground electrode of the substrate, and a circuit connection portion connected to the signal circuit at a position different from the ground connection portions.

20 Claims, 10 Drawing Sheets

ELECTRONIC MODULE

CROSS REFERENCE TO RELATED APPLICATIONS

This application claims the benefit of priority to Japanese Patent Application No. 2017-170712 filed on Sep. 5, 2017 and is a Continuation Application of PCT Application No. PCT/JP2018/029759 filed on Aug. 8, 2018. The entire contents of each application are hereby incorporated herein by reference.

BACKGROUND OF THE INVENTION

1. Field of the Invention

The present invention relates to an electronic module, and more specifically, to an electronic module with radio communication capabilities.

2. Description of the Related Art

With the development of radio communication technology, various electronic devices equipped with radio communication capabilities have emerged recently. Electronic modules with radio communication capabilities are widely used in such electronic devices.

Japanese Unexamined Patent Application Publication No. 2007-142960 discloses an electronic module with radio communication capabilities. FIG. 10 illustrates an electronic module (i.e., module with a built-in antenna) 1000 disclosed in Japanese Unexamined Patent Application Publication No. 2007-142960. The electronic module 1000 illustrated in FIG. 10 is mounted on a motherboard 150 of an electronic device.

The electronic module 1000 includes a substrate (circuit board) 101. A plurality of electronic components (circuit components) 102 are mounted on the substrate 101. A metal case (box-shaped cover) 103 is attached to the substrate 101 so as to cover the electronic components 102. The metal case 103 is made by processing a sheet of metal.

The metal case 103 includes a circuit connection portion (power-feed conductor) 105 on one side of a slit 104, and a ground connection portion (short-circuit conductor) 106 on the other side of the slit 104. The metal case 103, in which the ground connection portion 106 is connected to the ground, defines and functions as a shield. The metal case 103 also defines and functions as an antenna by connecting the circuit connection portion 105 to an electronic circuit formed on the substrate 101.

The electronic module 1000 allows the metal case 103 to also define and function as an antenna, and thus, does not require an additional antenna outside the metal case. This means that the electronic module 1000 is smaller in size and lower in cost than conventional ones.

The electronic module 1000, which includes the metal case 103 made by processing a sheet of metal, is highly capable of blocking noise of high frequencies (hereinafter referred to as "high-frequency noise") but is less capable of blocking noise of low frequencies (hereinafter referred to as "low-frequency noise"). That is, the metal case 103 is highly capable of blocking high-frequency noise, but is limited in the capability to block low-frequency noise.

In the present application, noise is roughly categorized either as high-frequency noise or low-frequency noise in the following manner. For example, when an electronic module is equipped with a DC-DC converter, noise in the frequency band of several tens of kHz to several hundreds of kHz, generated by the DC-DC converter, is categorized as low-frequency noise. Also, for example, when the electronic module uses near field communication (NFC) for radio communication, noise in the frequency band of several MHz to several tens of MHz of NFC is categorized as low-frequency noise. Then, noise in any frequency band higher than those described above is categorized as high-frequency noise. That is, noise with frequencies of several tens of MHz or lower is categorized as low-frequency noise, and noise with frequencies of several hundreds of MHz or higher is categorized as high-frequency noise.

The electronic module 1000 is less capable of blocking low-frequency noise. For example, when the electronic module 1000 includes an internal DC-DC converter, low-frequency noise generated by the DC-DC converter cannot be fully blocked by the metal case 103 alone and may be emitted to the outside. Conversely, low-frequency noise may enter the electronic module 1000 from the outside and this may cause malfunction or functional degradation of the electronic module 1000.

SUMMARY OF THE INVENTION

Preferred embodiments of the present invention provide electronic modules in each of which emission of low-frequency noise and high-frequency noise from inside to outside is reduced, and entry of low-frequency noise and high-frequency noise from outside to inside is reduced.

An electronic module according to a preferred embodiment of the present invention includes a substrate including a pair of principal surfaces, an electronic component mounted on at least one of the principal surfaces of the substrate, a magnetic body provided on the at least one of the principal surfaces of the substrate so as to cover the electronic component, and a metal shield provided on at least a portion of an outer surface of the magnetic body. An electronic circuit is defined using the electronic component. The electronic circuit includes a signal circuit from which a signal to be transmitted to the outside of the metal shield is output and to which a signal received from outside the metal shield is input. The substrate includes a ground electrode. The metal shield includes at least one ground connection portion connected to the ground electrode of the substrate, and a circuit connection portion connected to the signal circuit at a position different from the ground connection portion.

It is preferable that by providing a slit in the metal shield, the metal shield defines a conductor pattern having a desired shape, and that the ground connection portion is provided at one end portion of the conductor pattern, and the circuit connection portion is provided at the other end portion of the conductor pattern. In this case, the conductor pattern is able to be used as an antenna. By adjusting the length and width of the conductor pattern, the inductance value of the conductor pattern is able to be adjusted, and the antenna characteristics of the conductor pattern are able to be adjusted.

An electronic module according to a preferred embodiment of the present invention includes a substrate including a pair of principal surfaces, an electronic component mounted on at least one of the principal surfaces of the substrate, a magnetic body provided on the at least one of the principal surfaces of the substrate so as to cover the electronic component, and a metal shield provided on at least a portion of an outer surface of the magnetic body. An electronic circuit is defined using the electronic component.

The electronic circuit includes a signal circuit from which a signal to be transmitted to the outside of the metal shield is output and to which a signal received from outside the metal shield is input. The substrate includes a ground electrode. The metal shield includes at least one ground connection portion connected to the ground electrode of the substrate. The signal circuit includes an antenna. The antenna and the metal shield are connected, with a magnetic field therebetween. In this case, the metal shield is able to be used as a relay antenna. In this case, the metal shield includes a ground connection portion alone, and does not include a circuit connection portion. The antenna included in the signal circuit may be, for example, a pattern antenna provided on the principal surface of the substrate, or an antenna element mounted as the electronic component on the principal surface of the substrate.

In this case, it is preferable that by providing a slit in the metal shield, the metal shield is divided into a plurality of portions, and at least a portion of the metal shield includes a conductor pattern having a desire shape. It is also preferable that the ground connection portion is provided at at least one end portion of the conductor pattern. In this case, the conductor pattern is able to be used as a relay antenna. By adjusting the length and width of the conductor pattern, the inductance value of the conductor pattern is able to be adjusted and the relay antenna characteristics of the conductor pattern is able to be adjusted.

It is also preferable that the signal circuit includes an RFIC. In this case, a signal output from the RFIC is able to be transmitted through the metal shield to the outside, and a signal received from outside by the metal shield is able to be input to the RFIC and processed.

It is also preferable that the electronic circuit includes a DC-DC converter. In this case, low-frequency noise generated by the DC-DC converter is able to be blocked mainly by the magnetic body. This reduces emission of low-frequency noise to the outside.

In the electronic modules according to preferred embodiments of the present invention, low-frequency noise is able to be blocked mainly by the magnetic body and high-frequency noise is able to be blocked mainly by the metal shield. The electronic modules according to preferred embodiments of the present invention thus reduce emission of low-frequency noise and high-frequency noise from inside to outside, and reduces entry of low-frequency noise and high-frequency noise from outside to inside.

The electronic modules according to preferred embodiments of the present invention each enable the metal shield to also define and function as an antenna or a relay antenna, and thus does not require an additional antenna or relay antenna. Thus, the electronic modules according to preferred embodiments of the present invention are able to be made smaller in size and lower in cost than conventional electronic modules.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
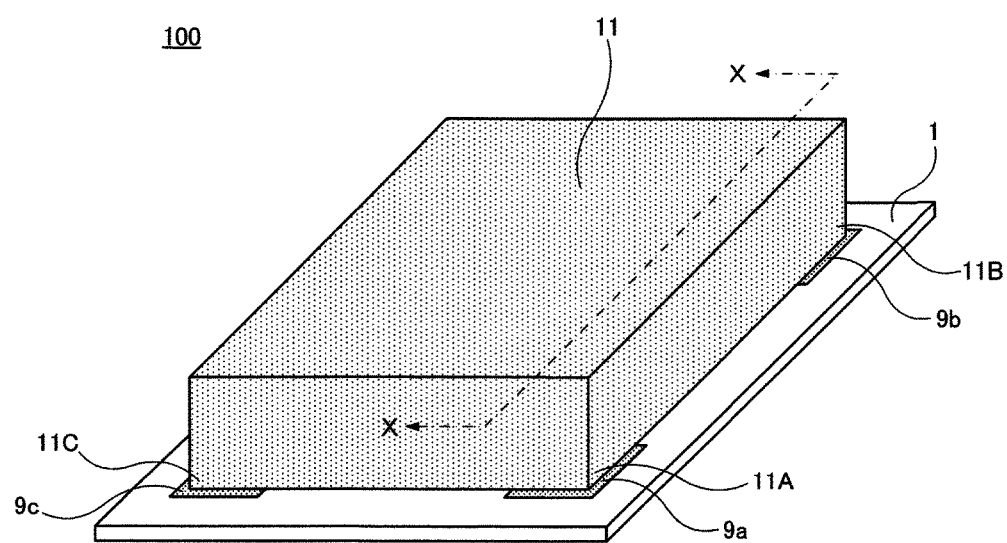
FIG. 1A is a perspective view of an electronic module 100 according to a first preferred embodiment of the present invention.

Preferred embodiments of the present invention will now be described with reference to the drawings.

Note that the preferred embodiments described below are merely illustrative of preferred embodiments of the present invention, and the present invention is not limited to the description of the preferred embodiments. Features described in different preferred embodiments may be provided in a combined manner, and the features are also included in the present invention. The drawings are to aid the understanding of the description and may be schematically drawn. The dimensions of component elements as drawn, or the ratios of the dimensions of the component elements, may differ from the dimensions or the ratios of the dimensions defined in the description. The component elements described in the description may be omitted or reduced in number in the drawings.

First Preferred Embodiment

Figure 1B:
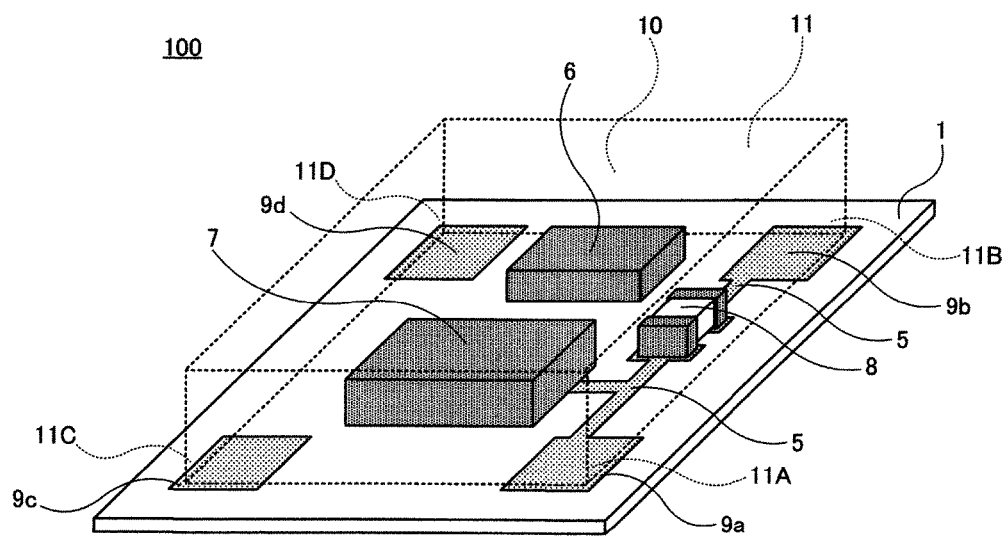
FIG. 1B is an exploded perspective view of the electronic module 100.
Figure 2A:
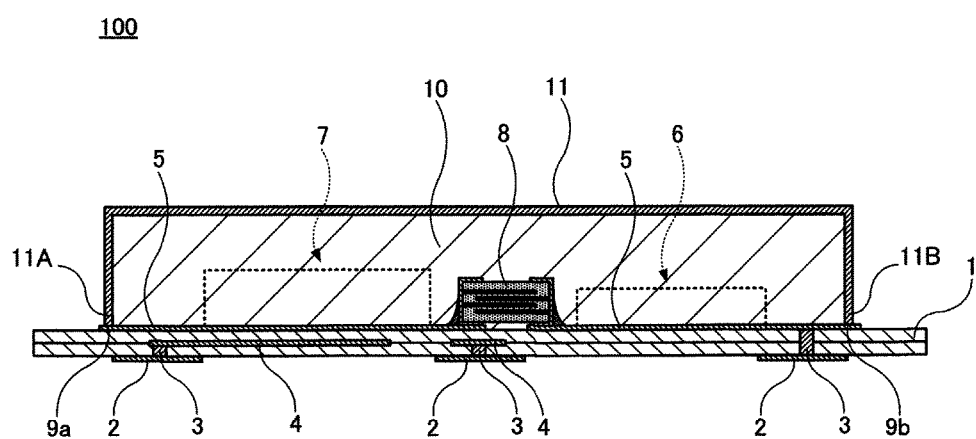
FIG. 2A is a cross-sectional view of the electronic module 100 taken along dot-and-dash line X-X in FIG. 1A.
Figure 2B:
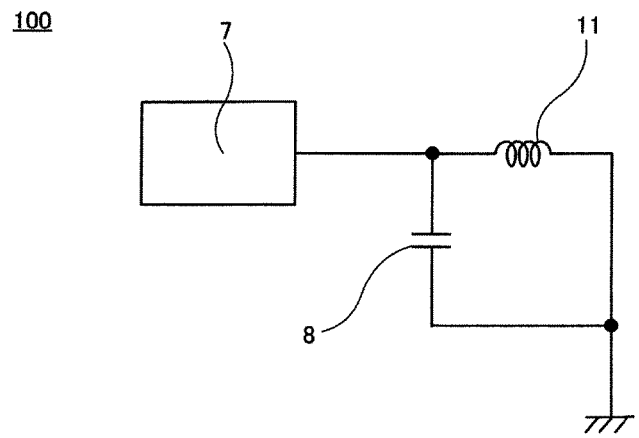
FIG. 2B is an equivalent circuit diagram of the electronic module 100.

FIGS. 1A and 1B and FIGS. 2A and 2B illustrate an electronic module 100 according to a first preferred embodiment of the present invention. FIG. 1A is a perspective view of the electronic module 100. FIG. 1B is an exploded perspective view of the electronic module 100, with a magnetic body 10 and a metal shield 11 (described below) omitted. FIG. 2A is a cross-sectional view of the electronic module 100 taken along dot-and-dash line X-X in FIG. 1A. FIG. 2B is an equivalent circuit diagram of a signal circuit and an antenna portion of the electronic module 100.

The electronic module 100 includes a substrate 1. In the present preferred embodiment, a ceramic multilayer substrate is preferably used as the substrate 1. The substrate 1 may be made of any material and, for example, a resin substrate may be used instead of a ceramic substrate. Also, the substrate 1 may have any suitable structure and a single layer substrate may be used, instead of a multilayer substrate.

Outer electrodes 2 are provided on a lower principal surface of the substrate 1. The outer electrodes 2 are used to mount the electronic module 100, for example, on a motherboard of an electronic device.

Via electrode 3 and interlayer electrodes 4 are provided inside the substrate 1.

A wiring electrode 5 is provided on an upper principal surface of the substrate 1. The wiring electrode 5 is connected at a predetermined portion thereof to a predetermined one of the outer electrodes 2 through the corresponding via electrode 3 and/or interlayer electrode 4.

A plurality of electronic components are mounted on the wiring electrode 5 on the upper principal surface of the substrate 1. In the present preferred embodiment, the electronic components mounted on the wiring electrode 5 preferably include, for example, a DC-DC converter 6, a radio frequency integrated circuit (RFIC) 7, and a capacitor 8. Any types and numbers of electronic components may be mounted on the wiring electrode 5, and the types and numbers are not limited to those described above.

The DC-DC converter 6, the RFIC 7, and the capacitor 8 mounted on the wiring electrode 5 define an electronic circuit. The electronic circuit includes a signal circuit from which a signal to be transmitted to the outside is output, and to which a signal received from the outside is input. The signal circuit is defined by the RFIC 7 in the present preferred embodiment, but may be defined by adding other electronic components to the RFIC 7.

The RFIC 7 in the present preferred embodiment is preferably, for example, an RFIC for near field radio communication (NFC) which performs communication in the frequency band of several MHz to several tens of MHz. The frequency band of the signal circuit may be any frequency band, and may be outside the frequency band described above.

Four connection electrodes 9a, 9b, 9c, and 9d connected to the metal shield 11 (described below) are provided on the upper principal surface of the substrate 1.

The connection electrode 9a is connected through the wiring electrode 5 to an input and output terminal of the RFIC 7.

The connection electrodes 9b, 9c, and 9d have respective ground potentials. That is, the connection electrodes 9b, 9c, and 9d are each connected, through the via electrode 3 and/or interlayer electrode 4 provided in the substrate 1, to the outer electrode 2 connected to the ground.

The connection electrode 9b is connected through the wiring electrode 5 to the input and output terminal of the RFIC 7, with the capacitor 8 provided along the path.

The outer electrodes 2, the via electrodes 3, the interlayer electrodes 4, the wiring electrode 5, and the connection electrodes 9a, 9b, 9c, and 9d provided on or in the substrate 1 may be made of any materials, and various types of metals (including alloys) may be used. In the present preferred embodiment, Cu, for example, is preferably used for the outer electrodes 2, the via electrodes 3, the interlayer electrodes 4, the wiring electrode 5, and the connection electrodes 9a, 9b, 9c, and 9d.

The magnetic body (magnetic layer) 10 is provided on the upper principal surface of the substrate 1 so as to cover the DC-DC converter 6, the RFIC 7, and the capacitor 8. In the present preferred embodiment, a resin mixed with magnetic ferrite powder, for example, is preferably used for the magnetic body 10. That is, in the present preferred embodiment, the electronic components (DC-DC converter 6, RFIC 7, and capacitor 8) of the electronic circuit are encapsulated in a resin containing magnetic powder. Note, however, that the magnetic body 10 may be of any suitable material. Instead of the resin mixed with magnetic ferrite powder, a resin mixed with magnetic metal powder may be used for the magnetic body 10.

The metal shield 11 is provided on the outer surface of the magnetic body 10. The metal shield 11 may be made of any suitable materials and have any suitable configuration. For example, the metal shield 11 may preferably have a three-layer structure that includes a contact layer made of Ti, Ni, Cr, or SUS, or an alloy of these materials, a conductive layer made of Cu, Al, or Ag or an alloy of these materials, and a corrosion-resistant layer made of Ti, Ni, or Cr or an alloy of these materials. For simplicity, FIG. 2A shows the metal shield 11 as a single layer, instead of dividing it into the contact layer, the conductive layer, and the corrosion-resistant layer. The structure of the metal shield 11 is not limited to the three-layer structure. The metal shield 11 may have any structure which includes one or more layers.

The metal shield 11 includes a circuit connection portion 11A and ground connection portions 11B, 11C, and 11D. The metal shield 11 includes three ground connection portions 11B, 11C, and 11D in the present preferred embodiment, but may include more than, or less than, three ground connection portions, as long as it includes at least one ground connection portion.

The circuit connection portion 11A is connected to the connection electrode 9a. As described above, the connection electrode 9a is connected through the wiring electrode 5 to the input and output terminal of the RFIC 7.

The ground connection portion 11B is connected to the connection electrode 9b. As described above, the connection electrode 9b has a ground potential and is connected through the wiring electrode 5 to the input and output terminal of the RFIC 7, with the capacitor 8 inserted along the path.

The ground connection portion 11C is connected to the connection electrode 9c. As described above, the connection electrode 9c has a ground potential.

The ground connection portion 11D is connected to the connection electrode 9d. As described above, the connection electrode 9d has a ground potential.

In the electronic module 100, the metal shield 11 has a predetermined inductance value and defines and functions as an antenna. In the electronic module 100, as illustrated in FIG. 2B, the metal shield 11 and the capacitor 8 are connected in parallel between the input and output terminal of the RFIC 7 and the ground so as to define a parallel resonator (parallel resonance circuit). In the electronic module 100, the antenna characteristics are able to be adjusted by adjusting the inductance value of the metal shield 11 and the capacitance value of the capacitor 8. In the electronic module 100, a signal output from the RFIC (signal circuit) 7 is transmitted from the metal shield 11 to the outside, and a signal received from the outside by the metal shield 11 is input to the RFIC 7 and processed. By providing a parallel resonance circuit, the impedance of the metal shield 11 increases at a resonant frequency and this enables the metal shield 11 to define and function as an antenna, whereas in other frequency bands, at which the impedance of the metal shield 11 is lower, the potential of the metal shield 11 becomes the same as the ground potential and the metal shield 11 defines and functions as a shield.

For the metal shield 11 to be used as an antenna, the metal shield 11 needs to have a relatively large inductance value. The metal shield 11, which is provided on the outer surface of the magnetic body 10, has a relatively large inductance value.

In the electronic module 100, low-frequency noise is blocked mainly by the magnetic body 10. Also, in the electronic module 100, high-frequency noise is blocked mainly by the metal shield 11. The electronic module 100 thus reduces emission of low-frequency noise and high-frequency noise from inside to outside, and reduces entry of low-frequency noise and high-frequency noise from outside to inside.

The electronic module 100 enables the metal shield 11 to also define and function as an antenna, and thus, does not require an additional antenna. Thus, the electronic module 100 is smaller in size and lower in cost than conventional ones.

The electronic module 100 may be manufactured, for example, by the following non-limiting example of a method.

First, the substrate 1 already including the outer electrodes 2, the via electrodes 3, the interlayer electrodes 4, the wiring electrode 5, and the connection electrodes 9a, 9b, 9c, and 9d is prepared.

Next, the DC-DC converter 6, the RFIC 7, and the capacitor 8 are mounted, for example, by soldering onto the substrate 1.

Next, the magnetic body 10 is formed on the upper principal surface of the substrate 1 so as to cover the DC-DC converter 6, the RFIC 7, and the capacitor 8. Specifically, for example, a semi-solid resin mixed with magnetic ferrite powder is poured over the DC-DC converter 6, the RFIC 7, and the capacitor 8 and heated to cure the resin so as to form the magnetic body 10. At this point, the connection electrodes 9a, 9b, 9c, and 9d formed on the substrate 1 each need to be at least partially exposed from the magnetic body 10.

Next, the metal shield 11 is formed by performing sputtering on the outer surface of the magnetic body 10. The circuit connection portion 11A of the metal shield 11 is thus connected to the connection electrode 9a. At the same time, the ground connection portion 11B, the ground connection portion 11C, and the ground connection portion 11D of the metal shield 11 are connected to the connection electrode 9b, the connection electrode 9c, and the connection electrode 9d, respectively.

This completes the manufacture of the electronic module 100.

Second Preferred Embodiment

Figure 3A:
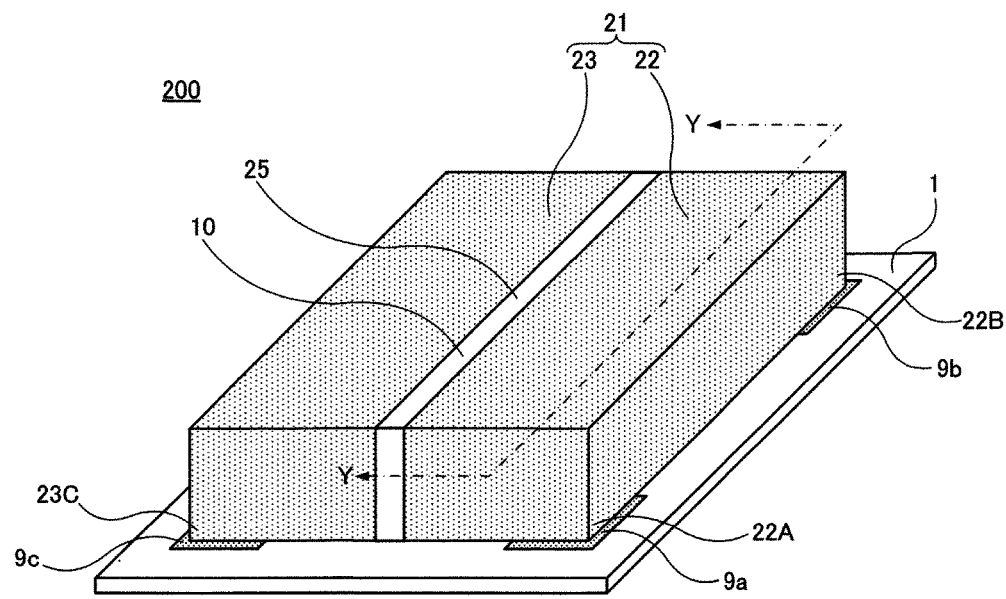
FIG. 3A is a perspective view of an electronic module 200 according to a second preferred embodiment of the present invention.
Figure 3B:
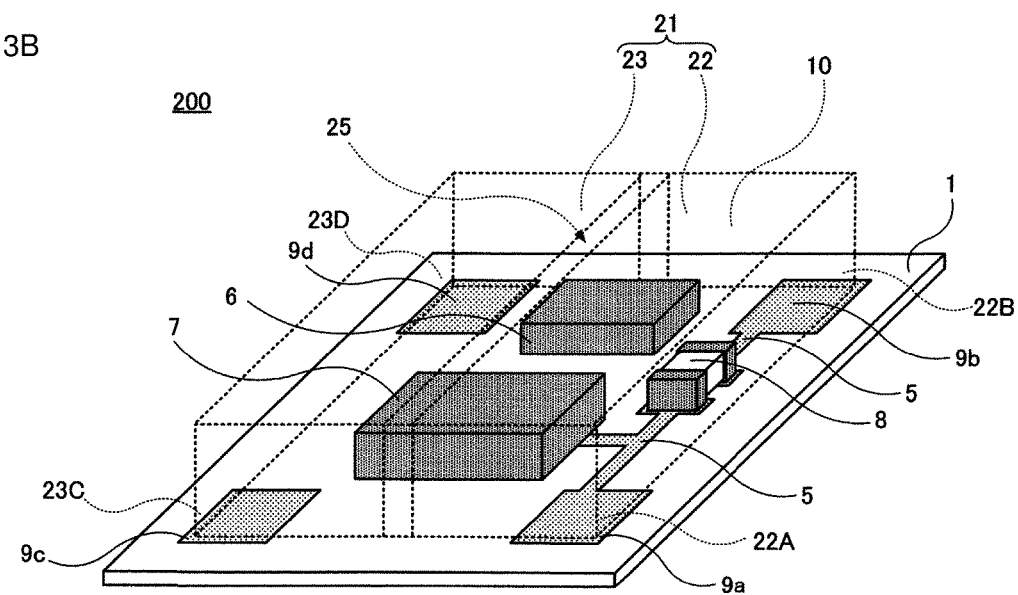
FIG. 3B is an exploded perspective view of the electronic module 200.
Figure 4A:
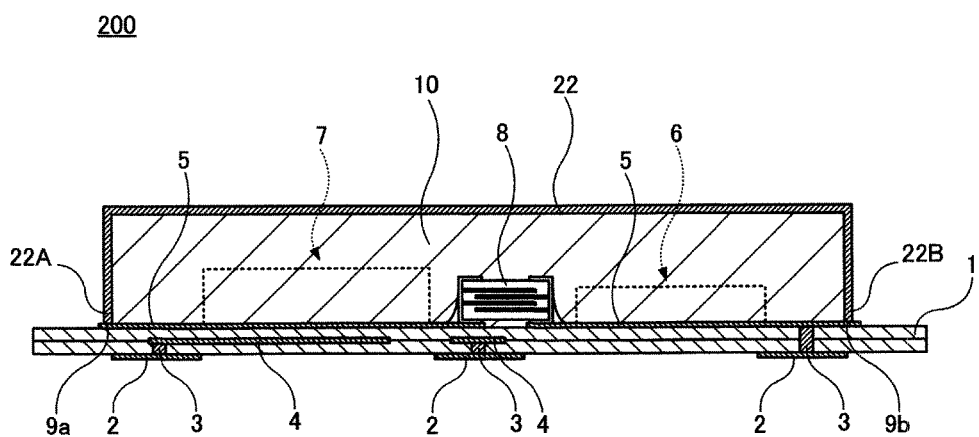
FIG. 4A is a cross-sectional view of the electronic module 200 taken along dot-and-dash line Y-Y in FIG. 3A.
Figure 4B:
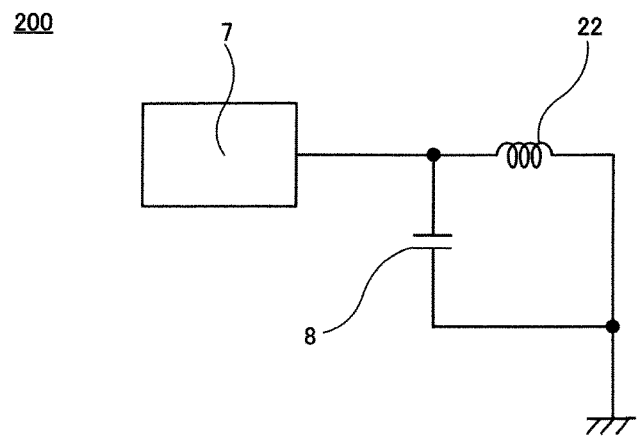
FIG. 4B is an equivalent circuit diagram of the electronic module 200.

FIGS. 3A and 3B and FIGS. 4A and 4B illustrate an electronic module 200 according to a second preferred embodiment of the present invention. FIG. 3A is a perspective view of the electronic module 200. FIG. 3B is an exploded perspective view of the electronic module 200, with the magnetic body 10 and a metal shield 21 (first metal shield portion 22, second metal shield portion 23) (described below) omitted. FIG. 4A is a cross-sectional view of the electronic module 200 taken along dot-and-dash line Y-Y in FIG. 3A. FIG. 4B is an equivalent circuit diagram of a signal circuit and an antenna portion of the electronic module 200.

The electronic module 200 is obtained by partially modifying the configuration of the electronic module 100 according to the first preferred embodiment. Specifically, in the electronic module 100, the metal shield 11 is provided over the entire or substantially the entire outer surface of the magnetic body 10. In the electronic module 200, on the other hand, a slit 25, in which metal is absent, is provided in the metal shield 21 so as to divide the metal shield 21 into two portions, the first metal shield portion 22 and the second metal shield portion 23. The slit 25 allows exposure of the magnetic body 10. Note that although such an expression as "slit is provided in the metal shield" may be used in the present application for the sake of convenience, the slit is not a portion of the metal shield in a strict sense. The remaining configuration of the electronic module 200 is the same or substantially the same as that of the electronic module 100.

Specifically, the slit 25 extends from one side surface of the magnetic body 10 (i.e., from the side surface at the front in FIGS. 3A and 3B) across the top surface of the magnetic body 10 to the opposite side surface of the magnetic body 10.

The first metal shield portion 22 defines a conductor pattern. The first metal shield portion 22 includes a circuit connection portion 22A at one end portion thereof, and includes a ground connection portion 22B at the other end portion thereof. The circuit connection portion 22A is connected to the connection electrode 9a. As described above, the connection electrode 9a is connected to the input and output terminal of the RFIC 7. The ground connection portion 22B is connected to the connection electrode 9b. As described above, the connection electrode 9b has a ground potential and is connected through the wiring electrode 5 to the input and output terminal of the RFIC 7, with the capacitor 8 inserted along the path.

The second metal shield portion 23 includes two ground connection portions 23C and 23D. The ground connection portion 23C is connected to the connection electrode 9c, and the ground connection portion 23D is connected to the connection electrode 9d. As described above, the connection electrodes 9c and 9d have respective ground potentials.

In the electronic module 200, the first metal shield portion 22 defining a conductor pattern defines and functions as an antenna. The electronic module 200 includes an equivalent circuit illustrated in FIG. 4B. This equivalent circuit is the same or substantially the same as the equivalent circuit of the electronic module 100 illustrated in FIG. 2B. However, the inductance value of the first metal shield portion 22 of the electronic module 200 is preferably larger than the inductance value of the metal shield 11 of the electronic module 100.

That is, the distance from the circuit connection portion 22A to the ground connection portion 22B of the first metal shield portion 22 is larger than the distance from the circuit connection portion 11A to the ground connection portion 11C, which is the ground connection portion closest to the circuit connection portion 11A, in the metal shield 11 of the electronic module 100. Also, the width of the first metal shield portion 22 is preferably smaller than the width of the metal shield 11. This makes the inductance value of the first metal shield portion 22 larger than the inductance value of the metal shield 11. That is, the shortest antenna length of the first metal shield portion 22 is longer than that of the metal shield 11 of the electronic module 100.

In the electronic module 200, low-frequency noise is blocked mainly by the magnetic body 10. Also, in the electronic module 200, high-frequency noise is blocked mainly by the metal shield 21 (first metal shield portion 22 and second metal shield portion 23).

In the electronic module 200, the slit 25 may be formed by masking the outer surface of the magnetic body 10 before the metal shield 21 is formed by sputtering. Alternatively, the slit 25 may be formed by etching after the metal shield 21 is formed over the entire or substantially the entire outer surface of the magnetic body 10.

Third Preferred Embodiment

Figure 5:
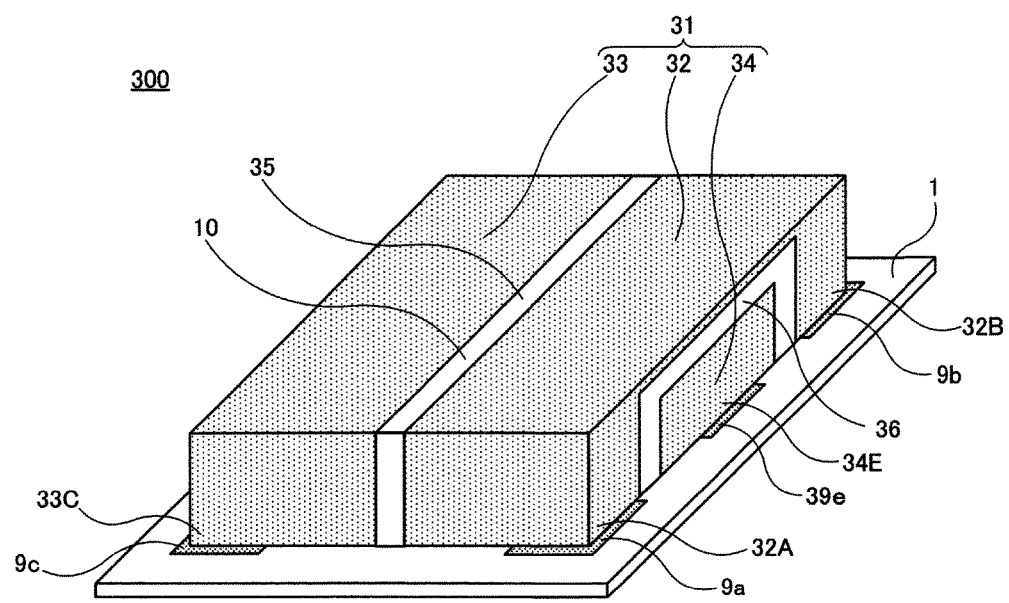
FIG. 5 is a perspective view of an electronic module 300 according to a third preferred embodiment of the present invention.

FIG. 5 illustrates an electronic module 300 according to a third preferred embodiment of the present invention. FIG. 5 is a perspective view of the electronic module 300.

The electronic module 300 is obtained by modifying the electronic module 200 according to the second preferred embodiment. Specifically, the electronic module 300 includes not only a slit 35 the same as or similar to the slit 25 of the electronic module 200, but also includes a U-shaped, second slit 36 in one side surface (right side surface in FIG. 5) of the magnetic body 10.

A metal shield 31 of the electronic module 300 is thus divided by the slits 35 and 36 into three portions, a first metal shield portion 32, a second metal shield portion 33, and a third metal shield portion 34.

The electronic module 300 further includes a connection electrode 39e having a ground potential on the upper principal surface of the substrate 1.

The first metal shield portion 32 defines a conductor pattern. The first metal shield portion 32 includes a circuit connection portion 32A at one end portion thereof, and includes a ground connection portion 32B at the other end portion thereof. The circuit connection portion 32A is connected to the connection electrode 9a. As described above, the connection electrode 9a is connected to the input and output terminal of the RFIC 7. The ground connection portion 32B is connected to the connection electrode 9b. As described above, the connection electrode 9b has a ground potential and is connected through the wiring electrode 5 to the input and output terminal of the RFIC 7, with the capacitor 8 inserted along the path.

The second metal shield portion 33 includes two ground connection portions 33C and 33D. Note however that the ground connection portion 33D is hidden and is not seen in FIG. 5. The ground connection portion 33C is connected to the connection electrode 9c, and the ground connection portion 33D is connected to the connection electrode 9d. As described above, the connection electrodes 9c and 9d have respective ground potentials.

The third metal shield portion 34 includes a ground connection portion 34E. The ground connection portion 34E is connected to the connection electrode 39e. As described above, the connection electrode 39e has a ground potential. If the third metal shield portion 34 is too small in area to substantially contribute to blocking of noise, the connection of the third metal shield portion 34 to the ground may be omitted.

In the electronic module 300, the first metal shield portion 32 defining a conductor pattern defines and functions as an antenna. The inductance value of the first metal shield portion 32 of the electronic module 300 is larger than the inductance value of the first metal shield portion 22 of the electronic module 200. That is, the antenna length of the first metal shield portion 32 of the electronic module 300 is longer than the antenna length of the first metal shield portion 22 of the electronic module 200.

Fourth Preferred Embodiment

Figure 6A:
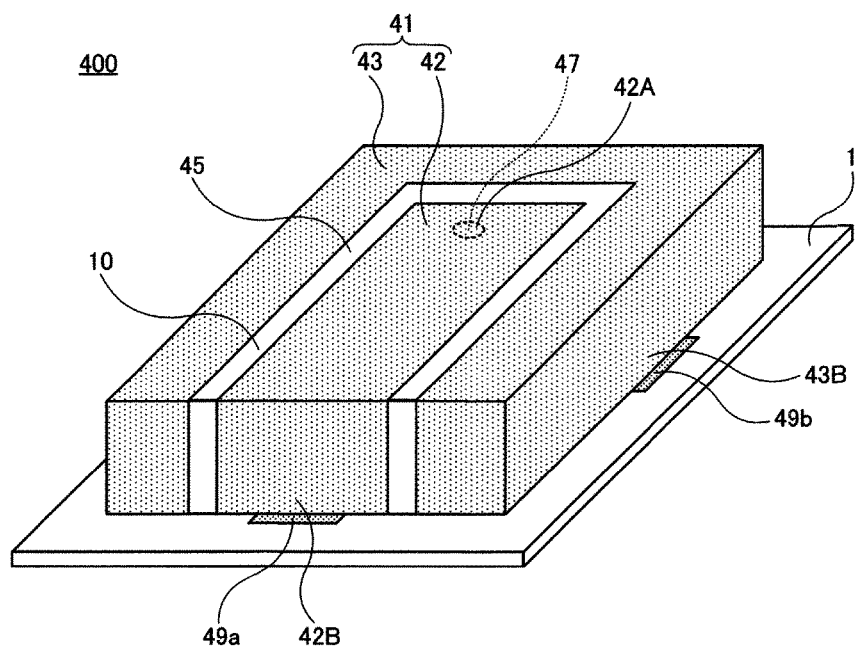
FIG. 6A is a perspective view of an electronic module 400 according to a fourth preferred embodiment of the present invention.
Figure 6B:
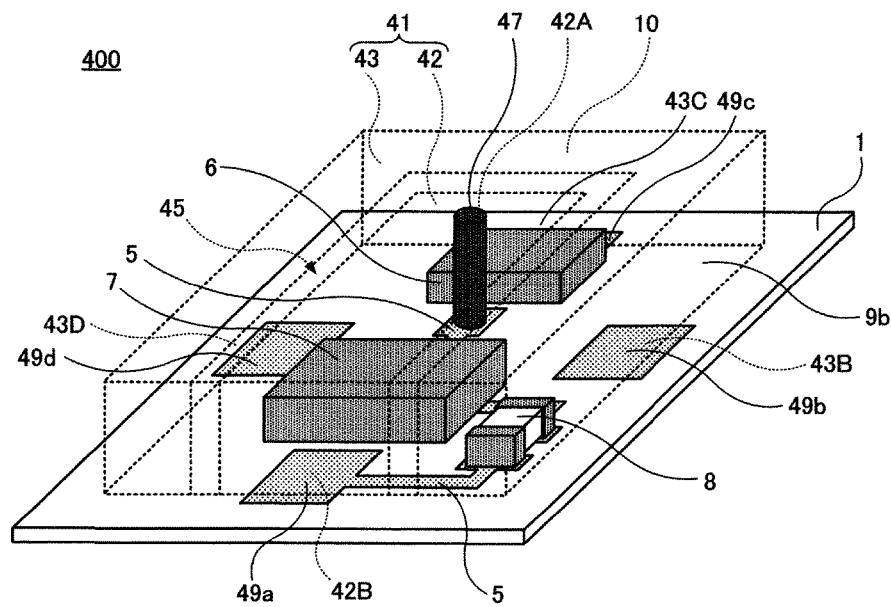
FIG. 6B is an exploded perspective view of the electronic module 400.

FIGS. 6A and 6B illustrate an electronic module 400 according to a fourth preferred embodiment of the present invention. FIG. 6A is a perspective view of the electronic module 400. FIG. 6B is an exploded perspective view of the electronic module 400, with the magnetic body 10 and a metal shield 41 (first metal shield portion 42 and second metal shield portion 43) (described below) omitted.

The electronic module 400 is also obtained by partially modifying the configuration of the electronic module 100 according to the first preferred embodiment. In the electronic module 100, the metal shield 11 is provided over the entire or substantially the entire outer surface of the magnetic body 10. In the electronic module 400, on the other hand, a slit 45 is provided in the metal shield 41 so as to divide the metal shield 41 into two portions, the first metal shield portion 42 and the second metal shield portion 43.

Specifically, in the metal shield 41 of the electronic module 400, the slit 45 has a U-shape extending from one side surface of the magnetic body 10 (i.e., from the side surface at the front in FIGS. 6A and 6B) along the top surface of the magnetic body 10, turns around, and returns back to the same side surface. The region inside the slit 45 is the first metal shield portion 42, and the region outside the slit 45 is the second metal shield portion 43.

The electronic module 400 includes four connection electrodes 49a, 49b, 49c, and 49d at positions different from those in the electronic module 100.

The connection electrodes 49a, 49b, 49c, and 49d have respective ground potentials.

The connection electrode 49a is connected through the wiring electrode 5 to the input and output terminal of the RFIC 7, with the capacitor 8 inserted along the path.

In the electronic module 400, a metal pin terminal 47 is disposed upright on the upper principal surface of the substrate 1. The metal pin terminal 47 is also connected through the wiring electrode 5 to the input and output terminal of the RFIC 7.

The first metal shield portion 42 defines a conductor pattern. The first metal shield portion 42 includes a circuit connection portion 42A at one end portion thereof, and includes a ground connection portion 42B at the other end portion thereof. The circuit connection portion 42A is connected to the metal pin terminal 47. As described above, the metal pin terminal 47 is connected to the input and output terminal of the RFIC 7. The ground connection portion 42B is connected to the connection electrode 49a. As described above, the connection electrode 49a has a ground potential.

The second metal shield portion 43 includes three ground connection portions 43B, 43C, and 43D. The ground connection portion 43B is connected to the connection electrode 49b, the ground connection portion 43C is connected to the connection electrode 49c, and the ground connection portion 43D is corresponding to the connection electrode 49d. As described above, the connection electrodes 49b, 49c, and 49d have respective ground potentials.

In the electronic module 400, the first metal shield portion 42 defining a conductor pattern defines and functions as an antenna.

As in the electronic module 400, the metal pin terminal may be used to make the connection between the circuit connection portion 42A of the first metal shield portion 42 and the input and output terminal of the RFIC (signal circuit) 7.

Fifth Preferred Embodiment

Figure 7A:
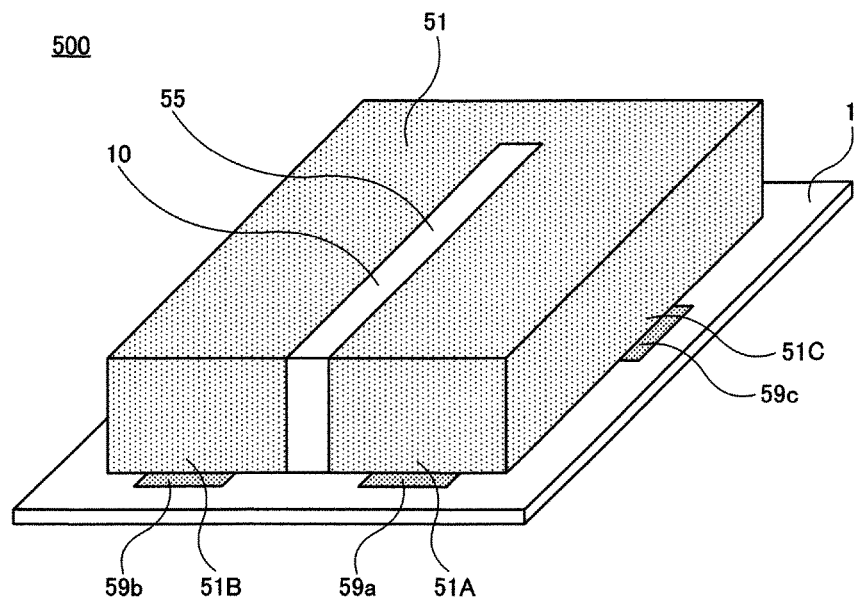
FIG. 7A is a perspective view of an electronic module 500 according to a fifth preferred embodiment of the present invention.
Figure 7B:
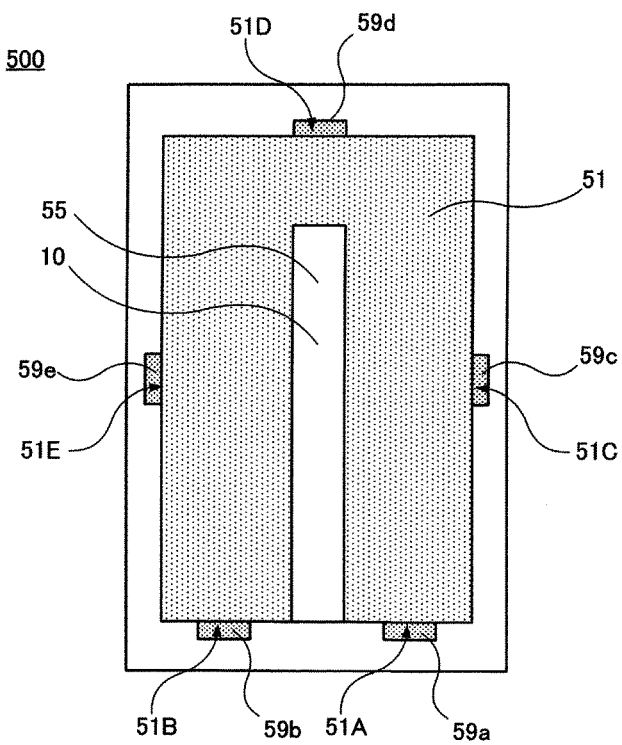
FIG. 7B is a plan view of the electronic module 500.

FIGS. 7A and 7B illustrate an electronic module 500 according to a fifth preferred embodiment of the present invention. FIG. 7A is a perspective view of the electronic module 500. FIG. 7B is a plan view of the electronic module 500.

In the electronic module 500, a metal shield 51 is provided on the outer surface of the magnetic body 10. In the metal shield 51, a slit 55 extends from one side surface of the magnetic body 10 (i.e., from the side surface at the front in FIG. 7A) along the top surface of the magnetic body 10.

Also in the electronic module 500, five connection electrodes 59a, 59b, 59c, 59d, and 59e are provided on the upper principal surface of the substrate 1.

The connection electrode 59a is connected to the input and output terminal of the internal RFIC (not shown).

The connection electrode 59b has a ground potential.

The connection electrodes 59c, 59d, and 59e are floating electrodes (non-contact electrodes), which are not connected to anything.

The metal shield 51 defines a long conductor pattern by including the slit 55. The metal shield 51 includes a circuit connection portion 51A at one end portion thereof, and includes a ground connection portion 51B at the other end portion thereof. The circuit connection portion 51A is connected to the connection electrode 59a connected to the input and output terminal of the RFIC, and the ground connection portion 51B is connected to the connection electrode 59b having a ground potential.

The metal shield 51 also includes connection portions 51C, 51D, and 51E between the circuit connection portion 51A and the ground connection portion 51B. The connection portion 51C is connected to the connection electrode 59c, the connection portion 51D is connected to the connection electrode 59d, and the connection portion 51E is connected to the connection electrode 59e. As described above, the connection electrodes 59c, 59d, and 59e are all floating electrodes.

In the electronic module 500, the metal shield 51 defines and functions as an antenna. By providing the slit 55, the metal shield 51 defines a long conductor pattern extending from the circuit connection portion 51A to the ground connection portion 51B, and thus has a large inductance value. That is, the metal shield 51 has a long antenna length.

If, in the electronic module 500, the connection portions 51C, 51D, and 51E are connected to the ground (i.e., if the connection electrodes 59c, 59d, and 59e are not floating electrodes and are connected to the ground), the inductance value of the metal shield 51 is reduced (i.e., the antenna length is reduced).

Sixth Preferred Embodiment

Figure 8A:
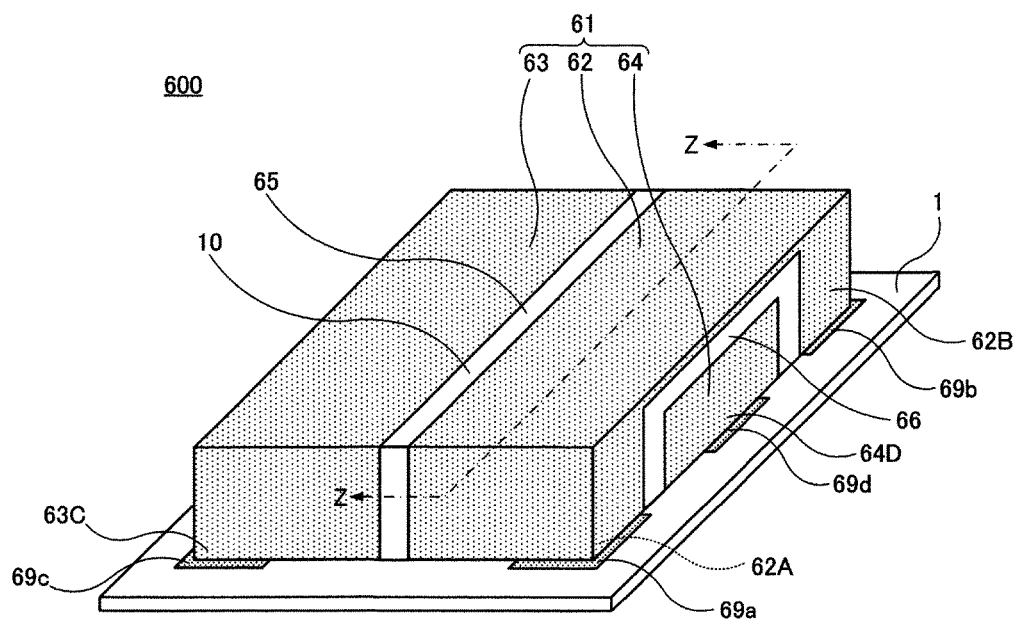
FIG. 8A is a perspective view of an electronic module 600 according to a sixth preferred embodiment of the present invention.
Figure 8B:
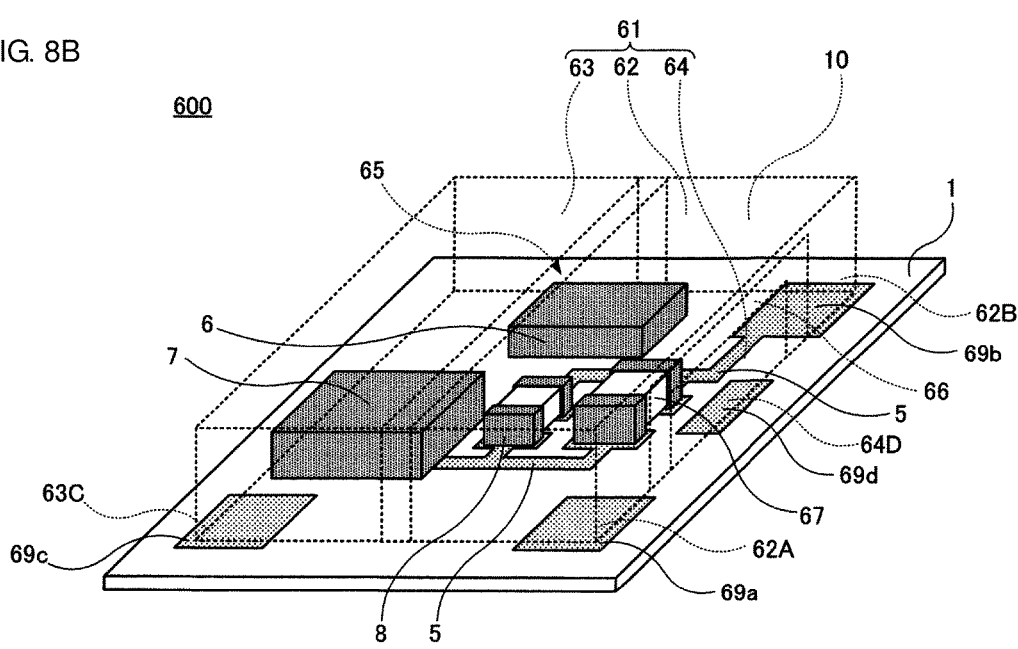
FIG. 8B is an exploded perspective view of the electronic module 600.
Figure 9A:
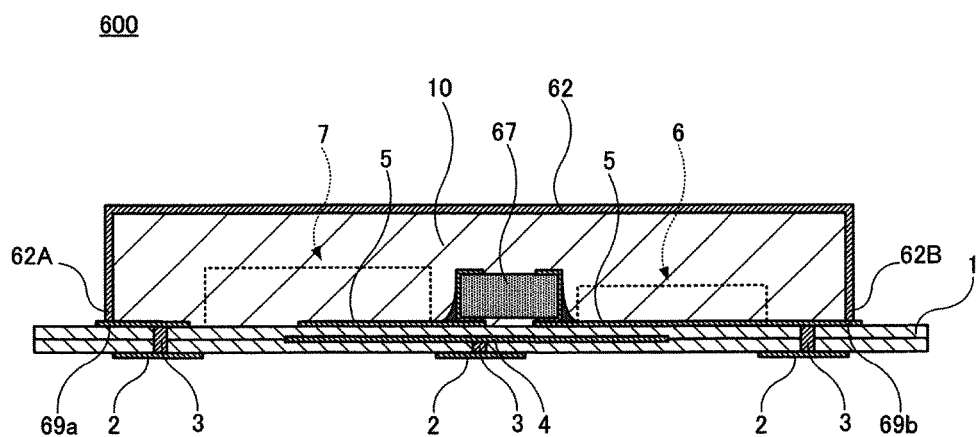
FIG. 9A is a cross-sectional view of the electronic module 600 taken along dot-and-dash line Z-Z in FIG. 8A.
Figure 9B:
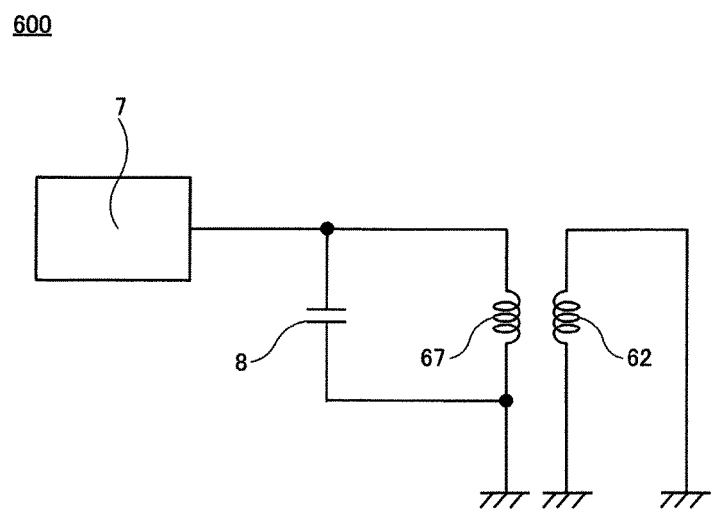
FIG. 9B is an equivalent circuit diagram of the electronic module 600.
Figure 10:
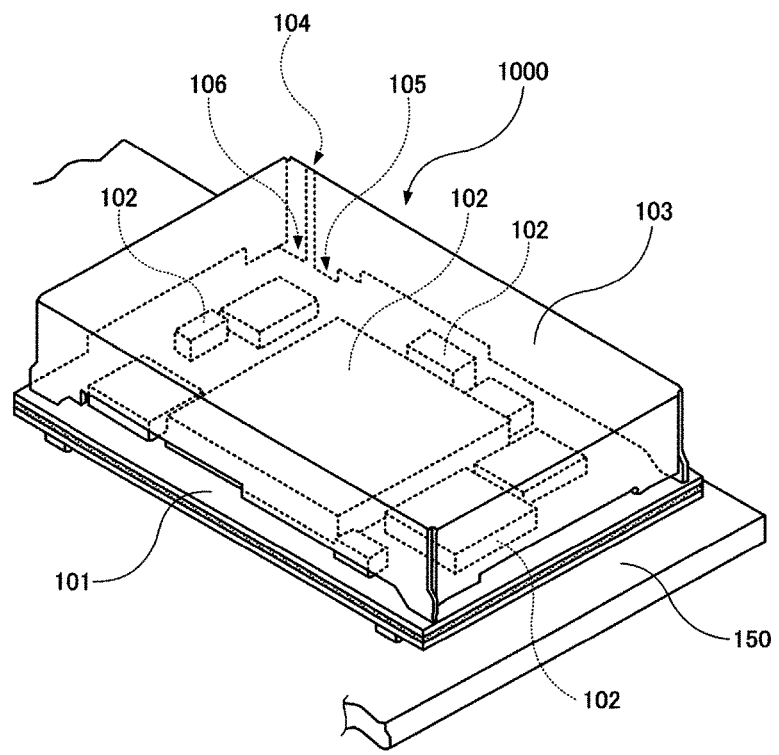
FIG. 10 is a perspective view (partial transparent view) of an electronic module 1000 disclosed in Japanese Unexamined Patent Application Publication No. 2007-142960.

FIGS. 8A and 8B and FIGS. 9A and 9B illustrate an electronic module 600 according to a sixth preferred embodiment of the present invention. FIG. 8A is a perspective view of the electronic module 600. FIG. 8B is an exploded perspective view of the electronic module 600, with the magnetic body 10 and a metal shield 61 (first metal shield portion 62, second metal shield portion 63, and third metal shield portion 64) (described below) omitted. FIG. 9A is a cross-sectional view of the electronic module 600 taken along dot-and-dash line Z-Z in FIG. 8A. FIG. 9B is an equivalent circuit diagram of a signal circuit and a relay antenna portion of the electronic module 600.

The electronic module 600 is obtained by making significant changes to the electronic module 100 according to the first preferred embodiment.

The electronic module 600 includes the substrate 1. The wiring electrode 5 is provided on the upper principal surface of the substrate 1.

The DC-DC converter 6, the RFIC 7, the capacitor 8, and an antenna element 67 are mounted on the wiring electrode 5 provided on the upper principal surface of the substrate 1.

The DC-DC converter 6, the RFIC (signal circuit) 7, the capacitor 8, and the antenna element 67 mounted on the wiring electrode 5 define an electronic circuit. The capacitor 8 and the antenna element 67 are connected in parallel to each other to define a parallel resonator.

Four connection electrodes 69a, 69b, 69c, and 69d are provided on the upper principal surface of the substrate 1. The four connection electrodes 69a, 69b, 69c, and 69d have respective ground potentials.

The parallel resonator defined by the capacitor 8 and the antenna element 67 is connected between the connection electrode 69b and the input and output terminal of the RFIC 7 through the wiring electrode 5.

The magnetic body 10 is provided on the upper principal surface of the substrate 1 so as to cover the DC-DC converter 6, the RFIC 7, the capacitor 8, and the antenna element 67. Alternatively, the DC-DC converter 6, the RFIC 7, the capacitor 8, and the antenna element 67 may be covered by a non-magnetic body, which is then covered by the magnetic body 10.

The metal shield 61 is provided on the outer surface of the magnetic body 10. The metal shield 61 includes two slits 65 and 66 to divide the metal shield 61 into three portions, the first metal shield portion 62, the second metal shield portion 63, and the third metal shield portion 64.

The first metal shield portion 62 defines a conductor pattern. The first metal shield portion 62 includes a ground connection portion 62A at one end portion thereof, and includes a ground connection portion 62B at the other end portion thereof. That is, the first metal shield portion 62 includes the ground connection portions 62A and 62B at both end portions thereof, and does not include a circuit connection portion. The ground connection portion 62A is connected to the connection electrode 69a, and the ground connection portion 62B is connected to the connection electrode 69b. As described above, the connection electrodes 69a and 69b have respective ground potentials.

The second metal shield portion 63 includes one ground connection portion 63C. The ground connection portion 63C is connected to the connection electrode 69c. As described above, the connection electrode 69c has a ground potential.

The third metal shield portion 64 includes one ground connection portion 64D. The ground connection portion 64D is connected to the connection electrode 69d. As described above, the connection electrode 69d has a ground potential.

In the electronic module 600, the first metal shield portion 62 defines and functions as a relay antenna. The first metal shield portion 62, which defines and functions as a relay antenna, and the antenna element 67 are connected to each other, with a magnetic field therebetween. A capacitor may be connected in parallel to the first metal shield portion 62 so that the first metal shield portion 62 and the capacitor define a parallel resonator. Note that the relay antenna refers to, for example, an antenna that receives a signal transmitted by an antenna element and then transmits the received signal to the outside, and receives a signal from the outside and then transmits the received signal to the antenna element.

FIG. 9B illustrates an equivalent circuit of the electronic module 600.

In the electronic module 600, a signal output from the input and output terminal of the RFIC 7 is transmitted by the antenna element 67, received by the first metal shield portion 62 defining and functioning as a relay antenna, and then transmitted by the first metal shield portion 62 to the outside. Also in the electronic module 600, a signal from the outside is received by the first metal shield portion 62 defining and functioning as a relay antenna, transmitted by the first metal shield portion 62 defining and functioning as a relay antenna, received by the antenna element 67, and input to the input and output terminal of the RFIC 7. A portion of the signal transmitted by the antenna element 67 is presumed to be directly transmitted to the outside without passing through the first metal shield portion 62 defining and functioning as a relay antenna. Similarly, a portion of the signal from the outside is presumed to be directly received by the antenna element 67 without passing through the first metal shield portion 62 defining and functioning as a relay antenna.

As described above, by mounting the antenna element 67 on the substrate 1 and then connecting the antenna element 67 and the first metal shield portion 62, with a magnetic field therebetween, the first metal shield portion 62 is able to be used as a relay antenna.

The electronic modules 100, 200, 300, 400, 500, and 600 according to the first to sixth preferred embodiments have been described. The present invention is not limited to the preferred embodiments described above, and various changes may be made in accordance with the spirit and scope of the present invention.

For example, the RFIC 7 used in the electronic modules 100, 200, 300, 400, 500, and 600 is preferably an RFIC for NFC which performs communication in the frequency band of several MHz to several tens of MHz. However, the frequency band of the signal circuit may be any frequency band, and may be outside the frequency band described above.

The slits 25, 35, 36, 45, 55, 65, and 66 are provided in corresponding ones of the metal shields 21, 31, 41, 51, and 61 in the electronic modules 200, 300, 400, 500, and 600, but the shapes, positions, and number of slits are not limited to those describe above. However, it is preferable, in the case of providing a slit, that the slit be partially provided in the top surface of the magnetic body 10.

The electronic module 600 includes the antenna element 67 mounted on the substrate 1, in addition to the first metal shield portion 62 defining and functioning as a relay antenna. Alternatively, the antenna element 67 may be replaced with a pattern antenna provided on the substrate 1 by a conductor pattern.

In the electronic module 600, the metal shield 61 includes the slits 65 and 66, so that the metal shield 61 is divided into three portions, the first metal shield portion 62, the second metal shield portion 63, and the third metal shield portion 64. Alternatively, the metal shield 61 may be simply used as a relay antenna without providing the slits 65 and 66.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic module comprising:
   a substrate including a pair of principal surfaces;
   an electronic component mounted on at least one of the principal surfaces of the substrate;
   a magnetic body provided on the at least one of the principal surfaces of the substrate so as to cover the electronic component; and
   a metal shield provided on at least a portion of an outer surface of the magnetic body; wherein
   an electronic circuit is defined using the electronic component;
   the electronic circuit includes a signal circuit from which a signal to be transmitted to an outside of the metal shield is output and to which a signal received from the outside the metal shield is input;
   the substrate includes a ground electrode; and
   the metal shield includes at least one ground connection portion connected to the ground electrode of the substrate, and a circuit connection portion connected to the signal circuit at a position different from the ground connection portion.

2. The electronic module according to claim 1, wherein
   a slit is provided in the metal shield such that the metal shield includes a conductor pattern;
   the ground connection portion is provided at one end portion of the conductor pattern; and
   the circuit connection portion is provided at another end portion of the conductor pattern.

3. The electronic module according to claim 1, wherein the signal circuit includes an RFIC.

4. The electronic module according to claim 1, wherein the electronic circuit includes a DC-DC converter.

5. The electronic module according to claim 1, wherein the magnetic body includes a resin mixed with a magnetic ferrite powder.

6. The electronic module according to claim 1, wherein the metal shield has a three-layer structure including a contact layer, a conductive layer, and a corrosion-resistant layer.

7. The electronic module according to claim 6, wherein the contact layer is made of Ti, Ni, Cr, or SUS, or an alloy of Ti, Ni, Cr, or SUS.

8. The electronic module according to claim 6, wherein the conductive layer is made of Cu, Al, or Ag, or an alloy of Cu, Al, or Ag.

9. The electronic module according to claim 6, wherein the corrosion-resistant layer is made of Ti, Ni, or Cr, or an alloy of Ti, Ni, or Cr.

10. The electronic module according to claim 2, wherein the slit extends from one side surface of the magnetic body across a top surface of the magnetic body to another side surface of the magnetic body opposite to the one side surface.

11. An electronic module comprising:
    a substrate including a pair of principal surfaces;
    an electronic component mounted on at least one of the principal surfaces of the substrate;
    a magnetic body provided on the at least one of the principal surfaces of the substrate so as to cover the electronic component; and
    a metal shield provided on at least a portion of an outer surface of the magnetic body; wherein
    an electronic circuit is defined using the electronic component;
    the electronic circuit includes a signal circuit from which a signal to be transmitted to an outside of the metal shield is output and to which a signal received from outside the metal shield is input;
    the substrate includes a ground electrode;

the metal shield includes at least one ground connection portion connected to the ground electrode of the substrate;

the signal circuit includes an antenna; and the antenna and the metal shield are connected, with a magnetic field therebetween.

12. The electronic module according to claim 11, wherein the antenna is a pattern antenna provided on the at least one principal surface of the substrate, or is an antenna element defined by the electronic component mounted on the at least one principal surface of the substrate.

13. The electronic module according to claim 11, wherein a slit is provided in the metal shield, such that the metal shield is divided into a plurality of portions, and at least a portion of the metal shield defines a conductor pattern; and the ground connection portion is provided at at least one end portion of the conductor pattern.

14. The electronic module according to claim 11, wherein the signal circuit includes an RFIC.

15. The electronic module according to claim 11, wherein the electronic circuit includes a DC-DC converter.

16. The electronic module according to claim 11, wherein the metal shield has a three-layer structure including a contact layer, a conductive layer, and a corrosion-resistant layer.

17. The electronic module according to claim 16, wherein the contact layer is made of Ti, Ni, Cr, or SUS, or an alloy of Ti, Ni, Cr, or SUS.

18. The electronic module according to claim 16, wherein the conductive layer is made of Cu, Al, or Ag, or an alloy of Cu, Al, or Ag.

19. The electronic module according to claim 16, wherein the corrosion-resistant layer is made of Ti, Ni, or Cr, or an alloy of Ti, Ni, or Cr.

20. The electronic module according to claim 13, wherein the slit extends from one side surface of the magnetic body across a top surface of the magnetic body to another side surface of the magnetic body opposite to the one side surface.

* * * * *